United States Patent [19]
Levinson

[11] Patent Number: 5,748,323
[45] Date of Patent: May 5, 1998

[54] METHOD AND APPARATUS FOR WAFER-FOCUSING

[75] Inventor: Harry J. Levinson, Sunnyvale, Calif.

[73] Assignee: Advanced Micro Devices, Sunnyvale, Calif.

[21] Appl. No.: 788,124

[22] Filed: Jan. 23, 1997

[51] Int. Cl.$^6$ .................................................. G01B 11/00
[52] U.S. Cl. ........................... 356/399; 356/123; 250/201
[58] Field of Search ................................. 356/399, 400, 356/401, 123; 250/201

[56] References Cited

U.S. PATENT DOCUMENTS

| | | | |
|---|---|---|---|
| 3,904,290 | 9/1975 | Kidd et al. | 356/399 |
| 4,506,977 | 3/1985 | Sato et al. | 356/399 X |
| 4,615,621 | 10/1986 | Allen | 356/399 |
| 4,717,257 | 1/1988 | Kaneta et al. | 356/399 |

Primary Examiner—Frank G. Font
Assistant Examiner—Reginald A. Ratliff
Attorney, Agent, or Firm—David H. Jaffer

[57] ABSTRACT

A method and apparatus wherein the height over the complete surface of interest on a wafer/material is scanned and mapped, using either a central or non-central focus system. The type of data gathered is similar to that which is normally acquired in operation of the particular focusing system indicative of the wafer/material surface height. The difference is that according to the present invention, a much larger number of data points are sampled and then processed in a novel manner to provide improved focus information. These data are stored and used to calculate corrections in both the vertical position/height and tilt of the material/wafer for each exposure field, such as the areas (34) in FIGS. 5b and 6b. The invention sorts out selected height data indicating periodic variations in surface height. Such data are normally not indicative of true wafer surface height variations, but instead are the result of periodic variations in wafer material composition caused by underlying structure relating to the particular circuitry. These periodic variations are distinguished from non-periodic variations, and are subtracted out of the total height measurement data to yield corrected surface height data. The present invention uses the corrected surface height data to calculate an optimum focus height for a given exposure area such as 34.

12 Claims, 5 Drawing Sheets

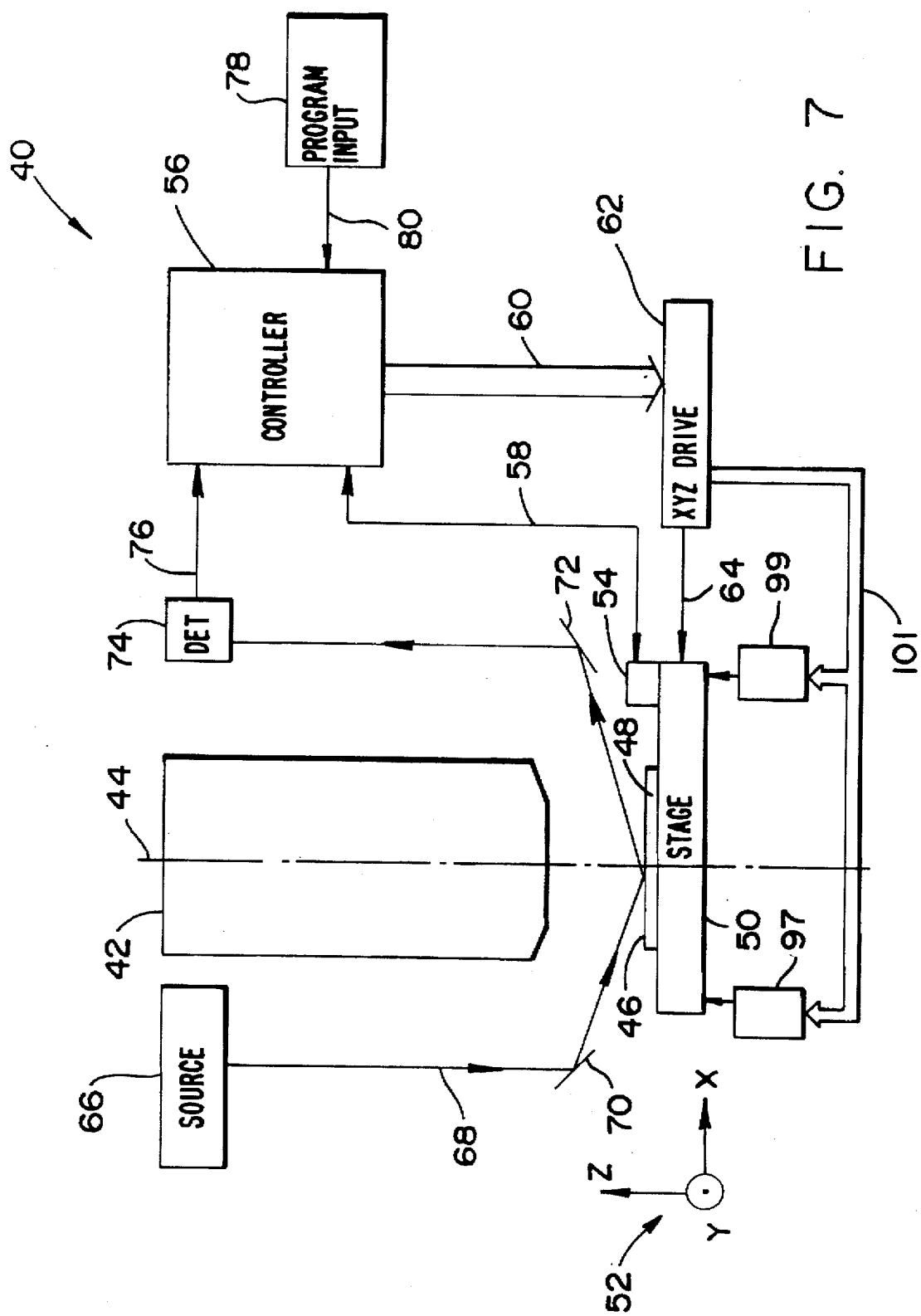

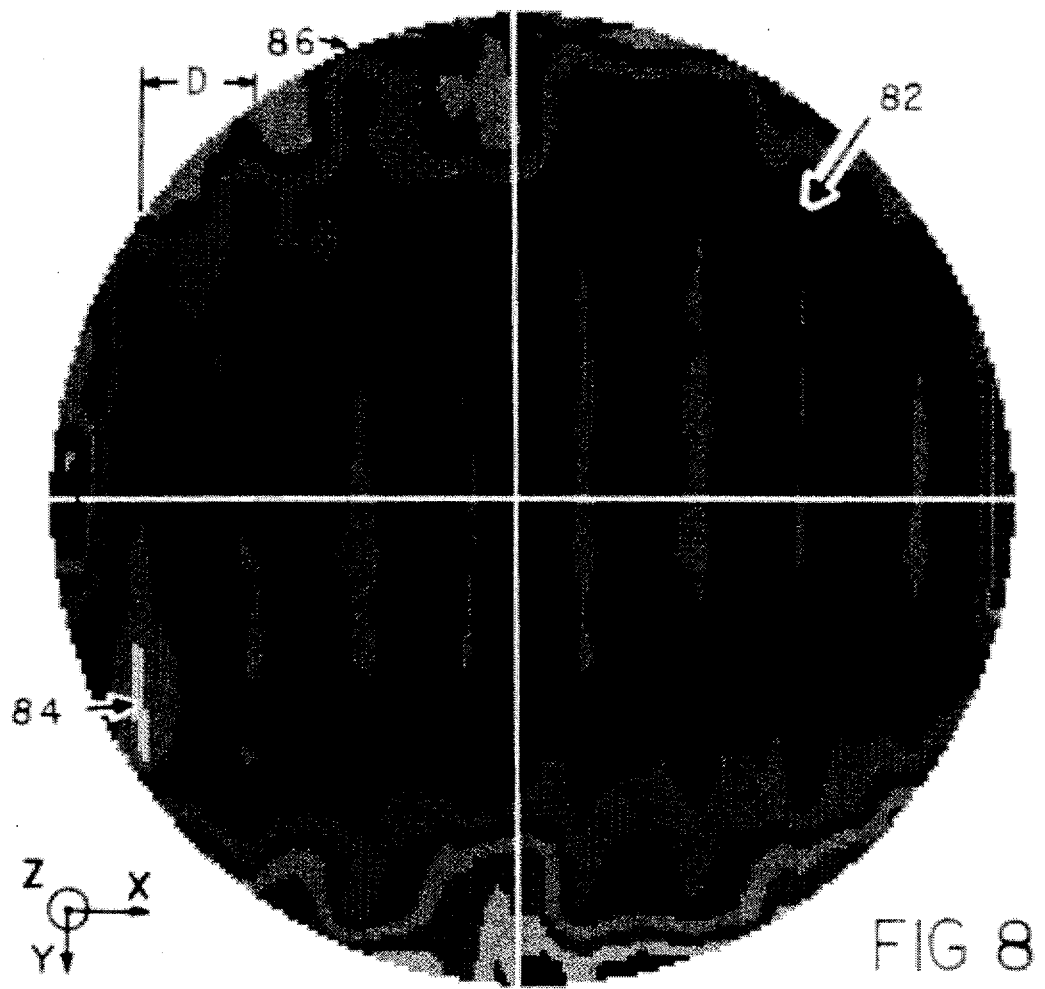
3 MM, 1MM, 0.175MM
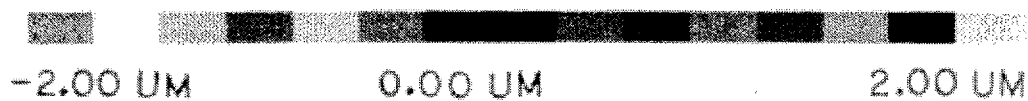
−2.00 UM    0.00 UM    2.00 UM
FIG 8

METHOD AND APPARATUS FOR WAFER-FOCUSING

BACKGROUND OF THE INVENTION

1. Technical Field

The present invention relates to methods and apparatus for focusing in lithographic systems and more particularly to a method and apparatus for correcting focus errors due to variations in material properties over an area of subject material to be processed.

2. Background Art

A variety of devices and methods have been used to determine the position of a surface along an optical axis for focusing, for example in lithographic systems and systems for measuring wafer flatness. Generally, they fall into one of two categories noted as either central or non-central focus systems. FIG. 1 shows a central focus system wherein a light source 10 projects a ray 12, which is reflected by a mirror 14 to a point 16 on a surface 18. The ray 12 is reflected off of the surface 18, and by mirror 20 to a detector 22. A change in position of the surface 18 along the optical axis 24 results in a change of the reflected ray, and by various means this is used to detect the surface 18 position. Because of inhomogeneity in the composition of the substrate, often due to circuit features, the light may not reflect specularly from the top of the physical surface. The reflected beam is then no longer indicative of the surface 18 position and causes focus errors. Multiple rays can be used to sample multiple points on a wafer.

Other types of position gauges include apparatus wherein the measurement is based on capacitance or air pressure. These devices must be remotely positioned from the central focusing area, and are known as non-central focusing systems. Such a system is indicated in FIG. 2, showing two position gauges 26 and 28. In a case where the gauges are of the capacitive type, the system has the disadvantage that variations in the composition of the material underlying surface 18 will affect the capacitance and cause faulty focusing.

In addition to errors introduced from material composition variations, either central or non-central systems can give erroneous focus indications due to the limited number of points that are sampled on the surface 18. The focusing system for a lithography system should minimize the largest focus error within each exposure field. This problem is illustrated in FIGS. 3 and 4. FIG. 3 illustrates a possible error "e" that can occur when a single point 30 is used, as in a central focusing system where an area of width w is being processed. For example, such an error could occur in a step and repeat process, where at a particular step the measurement point 30 differs in position along the optical axis by "e" from other points in the area. FIG. 4 illustrates a similar situation wherein an error "e" can occur when two focus gauges are used, taking measurements at points 32 and 34.

The errors indicated in FIGS. 3 and 4 that can occur due to the use of a limited number of measurement points, are particularly relevant in step and repeat systems, where at each step a particular area is illuminated in its entirety. Such a system is illustrated in FIG. 5a showing a wafer 33 illuminated over an area 34 through use of a lens 36 and reticle 37. The surface of the wafer 33 is illustrated in FIG. 5b, showing a number of the areas 34.

For very large scale integrated circuits (VLSI), an alternate system known as "step and scan" is currently preferred, and illustrated in FIG. 6a. The system illuminates only part of the areas 34 at any one time, and an entire area 34 is exposed by scanning the wafer 33 and reticle 38. The surface of the wafer is shown in FIG. 6b, wherein the smaller darkened area 39 indicates the illuminated portion of an area 34 at the start of a scan, and the attached arrow indicates the scan of the illumination across the area 34, which proceeds until the entire area has been illuminated. After the system illuminates one of the areas, it moves the next area 34 to the optimum focal point and repeats the illumination process by scanning the area 34. The advantage of such a system is that the optics can be tuned more precisely over a smaller, narrower part 39 of the lens than for a larger area 34, reducing the difficulty in fabricating the optics to a high degree of quality. In spite of the improved optics of step and scan methods, the same type of focus errors discussed above occur.

From the above discussion, it is therefore apparent that an improved focus system is needed to reduce the errors caused by variations in material composition and errors that occur due to the use of limited numbers of data points.

DISCLOSURE OF THE INVENTION

Briefly, a preferred embodiment of the present invention includes a method and apparatus wherein the height over the complete surface of interest on a wafer/material is scanned and mapped, using either a central or non-central focus system. The type of data gathered is similar to that which is normally acquired in operation of the particular focusing system indicative of the wafer/material surface height. The difference is that according to the present invention, a much larger number of data points are sampled and then processed in a novel manner to provide improved focus information. These data are stored and used to calculate corrections in both the vertical position/height and tilt of the material/wafer for each exposure field, such as the areas (34) in FIGS. 5b and 6b. The invention sorts out selected height data indicating periodic variations in surface height. Such data are normally not indicative of true wafer surface height variations, but instead are the result of periodic variations in wafer material composition caused by underlying structure relating to the particular circuitry. These periodic variations are distinguished from non-periodic variations, and are subtracted out of the total height measurement data to yield corrected surface height data. The present invention uses the corrected surface height data to calculate an optimum focus height for a given exposure area such as 34.

An advantage of the present invention is that it improves focusing accuracy in step and scan systems.

A further advantage of the present invention is that it improves focusing accuracy in step and repeat systems.

A still further advantage of the present invention is that it provides corrections for focusing errors caused by periodic subject material composition variations.

Another advantage of the present invention is that it optimizes focus in an illuminated wafer area containing real surface height irregularities.

BRIEF DESCRIPTION OF THE DRAWINGS

FIG. 7 shows a lithographic system utilizing the present invention;

FIG. 8 is a pattern indicative of wafer surface height data variations; and

MODE(S) FOR CARRYING OUT THE INVENTION

Figure 1:
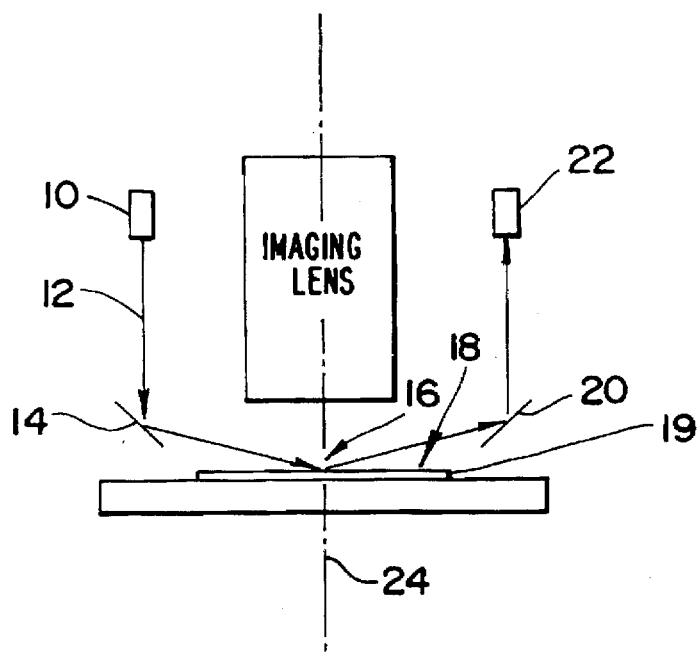
FIG. 1 illustrates a prior art central focusing system.
Figure 2:
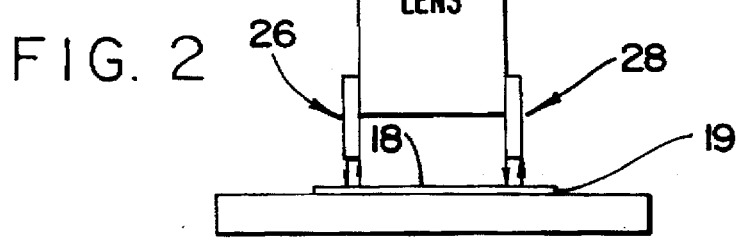
FIG. 2 illustrates a prior art non-central focusing system.

Referring now to FIG. 7 of the drawing, a block diagram of the preferred embodiment of the present invention is shown as applied to a lithographic system 40. There is a projection lens system 42 having an optical axis 44 for projecting a pattern on a surface 46 of material 48, such as a wafer, secured to a positionable stage 50. The x, y and z coordinates are as indicated at 52, the z axis in alignment with the optics axis. The x,y position of stage 50 is detected by detection apparatus 54 and transmitted to controller 56 through bus 58. The controller 56 responds to program input 78 and sends stage drive signals through bus 60 to xyz drive 62, which acts upon the stage 50, indicated by line 64, to control the x, y and z position of the stage 50.

The height of a particular point on the surface 46 of material 48 along the optic axis 44 is detected by a focusing system, which can be either the central or non-central type. For illustrative purposes, the system shown is of the central, optics type, and includes a light source 66 for emitting a ray 68, which is reflected by mirror 70 to the surface 46. The ray 68 is then reflected from surface 46 to mirror 72, which in turn reflects the ray to detector 74. A position indicating signal is then sent by detector 74 via line 76 to the controller 56.

According to the present invention for the purpose of gathering material 48 surface 46 height data, program input block 78 and input line 80 represent any type of programming of the controller 56 for directing the xyz drive 62 to scan the surface 46. As the stage 50 moves the material 48 back and forth across the optics axis 44, the controller 56 collects and stores corresponding uncorrected surface height data provided by the detector 74. The controller 56 then analyzes the stored data for periodic height variations occurring across the surface 46, and calculates corresponding periodic height variation data. The controller then subtracts the periodic height variation data from the uncorrected height data to obtain corrected height data. This corrected height data is then used to calculate the optimum focus height i.e. position/height of the material for optimum focus over a specified area of the surface 46.

Figure 3:
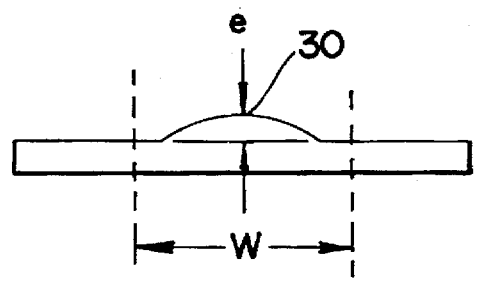
FIG. 3 shows an error "e" that can occur when using a central focusing system.
Figure 4:
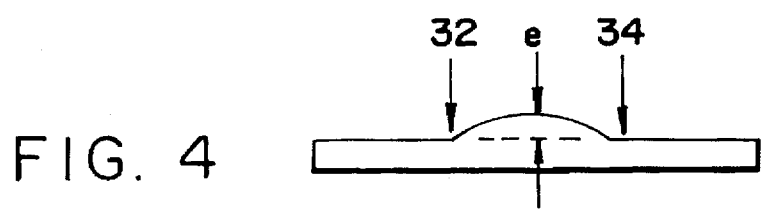
FIG. 4 illustrates how an error can occur when using a non-central focusing system.
Figure 5A:
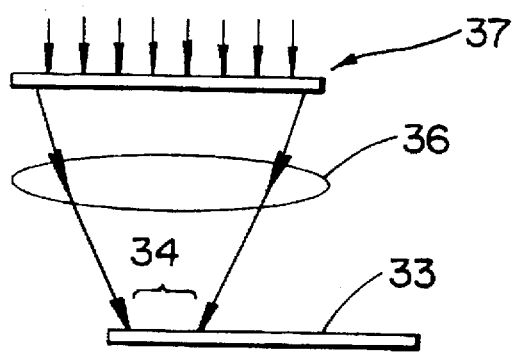
FIGS. 5a and 5b show a layout of identical circuits processed on a wafer by a prior art step and repeat system.
Figure 5B:
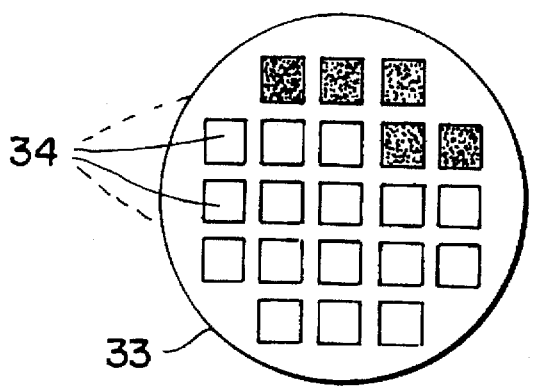
Figure 6A:
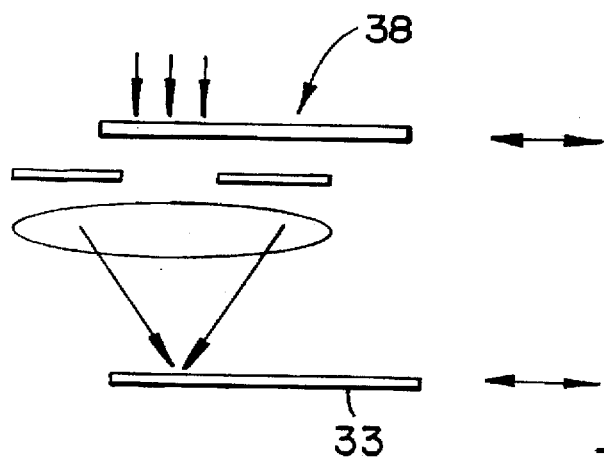
FIGS. 6a and 6b show how a prior art step and scan procedure processes narrow rectangles to improve space utilization and allow improved optics.
Figure 6B:
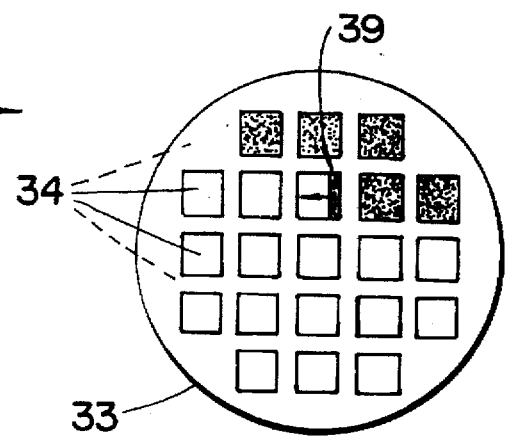

In order to calculate the optimum focus height, the controller 56 is programmed to perform operations based on the corrected height data for a given area being illuminated. For example, referring to FIG. 5b, the controller 56 would be programmed for a step and repeat operation wherein an entire area 34 is illuminated in a single exposure. In such a case, the controller is programmed to calculate a focus height based on all of the height data points from the particular area 34. This could, for example, be the "average" height, or a height according to some other formula. In the step and scan operation illustrated in FIG. 6b, the controller would be similarly programmed to calculate a focus height based on the data collected for each smaller area 39. It is apparent that the step and scan procedure of FIG. 6b has an advantage over the step and repeat procedure of FIG. 6a in addition to the improved optics as above discussed due to the smaller area. This additional advantage is that the controller calculates focus for a smaller area 39, which results in a more accurate focus since points outside a particular area 39 are not relevant and should not be included in the focus calculation. The errors occurring due to limited data points in prior art systems, as discussed in relation to FIGS. 3 and 4 are largely eliminated by the scanning procedure of the present invention, which collects large quantities of height data. The calculation done on this data results in the determination of an improved, optimum focus height for the material for each particular area being illuminated.

The height data acquired and stored from the scanning operation discussed above is actually relative height data. In order to arrive at actual optimum focus height data for adjusting the position of the stage, a constant is applied to the data. This constant is usually determined empirically during equipment calibration, a procedure well understood by those skilled in the art.

The above method can be used with any of the various focus systems, central on non-central, etc., and can be used with any method of moving the wafer/material surface relative to the optics axis, such as step and scan, step and repeat, etc. For step and repeat systems the focus errors due to substrate composition would normally repeat at every area 34, since the underlying circuitry, etc. would be the same for each area being illuminated. Because of this, fixed focus offsets can be used for compensation.

Referring now to FIG. 8, a pattern is shown representing height data obtained from scanning the surface of a wafer. The degree of darkness is indicative of the surface height. Note the dark gray areas 82 and the lighter gray areas 84. They show a periodicity of "d" in the x direction. These variations correspond to variations in material 48 properties due to underlying circuitry, etc and are not indicative of true wafer surface height variations. Such variations cause erroneous focusing if correction for them is not made. Real height variations are generally random in nature, and show no particular pattern. For example, note the variations around the wafer edges, such as at 86.

As discussed above, the present invention separates out the periodic data, normally indicative of artificial, non-real variations in surface height from data indicative of real variations that require a shift in the surface 46 height for optimum focus. The surface height corrected for periodic variations is expressed as $$f_c(x,y) = f(x,y) - f_p(x,y) \qquad (1)$$

where $f_p(x,y)$ is the periodic height data variation and can be modeled mathematically through use of a Fourier series as illustrated by equations (2) and (3).

$$f_p(x,y) = a_0 + \qquad (2)$$

$$\sum_{k_1} \sum_{k_2} \left[ a(k_1,k_2) \cos\left(\frac{2\pi k_1}{L_x} x\right) \cos\left(\frac{2\pi k_2}{L_y} y\right) + \right.$$
$$\left. b(k_1,k_2) \cos\left(\frac{2\pi k_1}{L_x} x\right) \sin\left(\frac{2\pi k_2}{L_y} y\right) \right] +$$
$$\sum_{k_1} \sum_{k_2} \left[ c(k_1,k_2) \sin\left(\frac{2\pi k_1}{L_x} x\right) \cos\left(\frac{2\pi k_2}{L_y} y\right) + \right.$$
$$\left. + d(k_1,k_2) \sin\left(\frac{2\pi k_1}{L_x} x\right) \sin\left(\frac{2\pi k_2}{L_y} y\right) \right]$$

where $$a(k_1,k_2) = \frac{4}{L_xL_y} \int_0^{L_y} \int_0^{L_x} \cos\left(\frac{2\pi k_1 x}{L_x}\right) \cos\left(\frac{2\pi k_2 y}{L_y}\right) dxdy, \text{etc.} \quad (3)$$

f(x,y) represents the raw, uncorrected material surface height data, where x and y represent a position on the material surface 46. $L_x$ and $L_y$ are the distances in the x and y direction between periodic variations, and generally correspond to the areas 34 in FIGS. 5b and 6b, and are therefore quantities known to the user of the lithographic equipment. $k_1=\pi/L_x$ and $k_2=\pi/L_y$ $a_o$ and a $(k_1\ k_2)\ldots d\ (k_1\ k_2)$ are the Fourier coefficients. The controller 56 calculates $f_p(x,y)$ from the measured height data f(x,y) and subtracts it from the measured data f(x,y) to obtain the corrected height data $f_c(x,y)$. Of course, as mentioned above, there is also a constant, non-varying height term (not shown). This is normally determined empirically by conventional methods.

Figure 9:
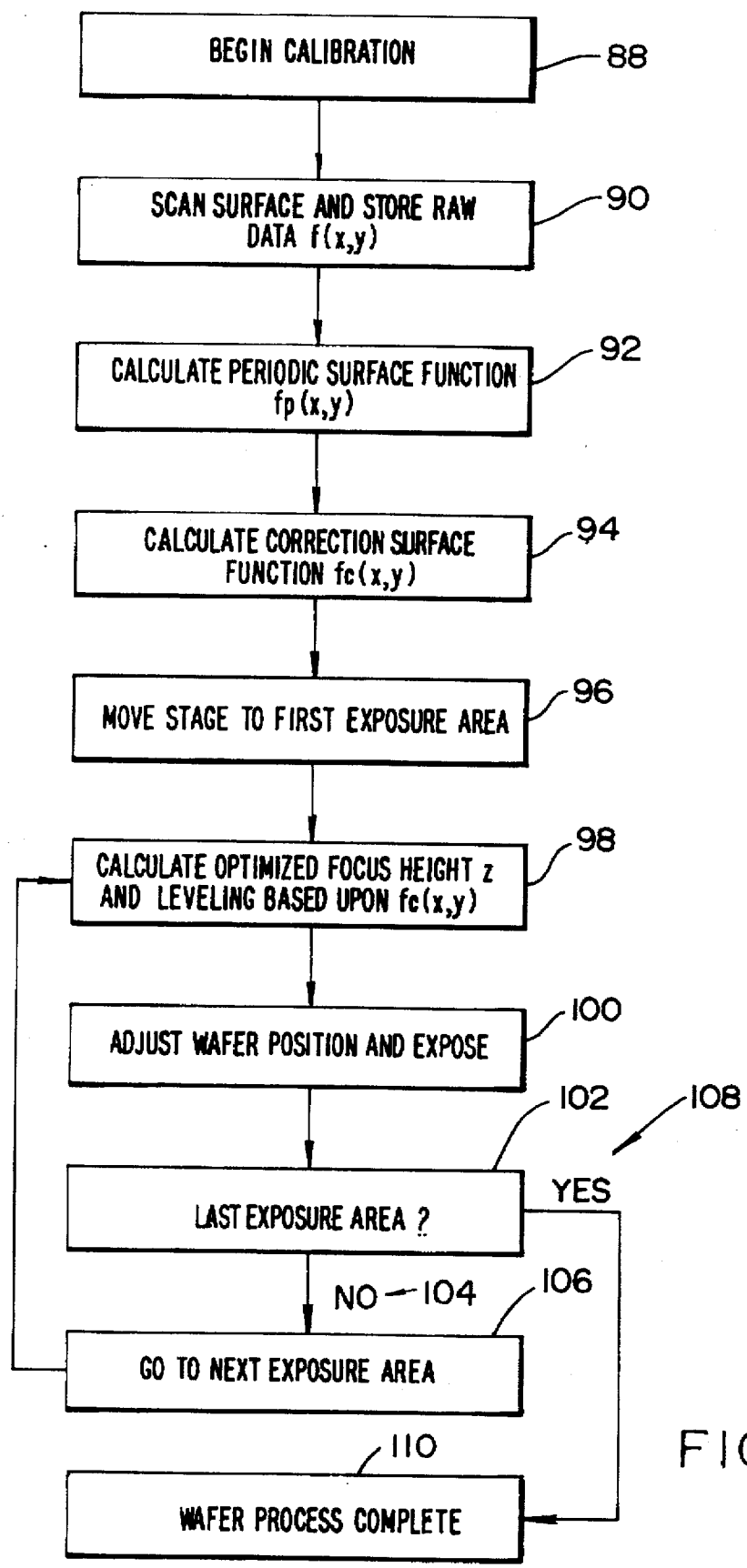
FIG. 9 is a flow chart describing how a preferred embodiment of the present invention functions in the lithographic system of FIG. 7.

Referring now to FIG. 9, a flow chart is shown illustrating a preferred embodiment of the processing performed by the controller 56 according to the present invention, functioning cooperatively in the system 40. Block 88 indicates the start up of the calibration routine. At this point a wafer/material 48 has already been loaded onto the stage 50, and the programmed x and y step and scan data has been loaded into the controller 56 from program input 78. This process is standard procedure and needs no further explanation for those skilled in the art. According to the present invention, in block 90, the controller is programmed for and scans the surface 46 and stores the raw height data f(x,y) for each programmed x, y position on surface 46 in a memory (not shown) in controller 56. The controller 56 then calculates the periodic height variation $f_p(x,y)$ from the uncorrected height data f(x,y) as indicated in block 92. The controller 56 then calculates the corrected height data $f_c(x,y)$, indicated in block 94.

The controller then directs the stage to move the wafer to the first exposure area (block 96). At this point, the controller uses the corrected height data $f_c(x,y)$ for the various data points in the first exposure area to calculate an optimized focus height (block 98). As mentioned above, this can be done in any of a number of ways. A preferred embodiment is to calculate the average height, and adjust according to the system constant which is normally empirically determined, as discussed above. In addition, the controller can determine if the area is as level as possible, i.e. perpendicular to the z axis, and calculate level adjustment data which can be applied to level adjusters, indicated as 97 and 99 in FIG. 7, and directed by the controller through line 60 in the xyz drive 62 and through bus 101.

Controller 56 then adjusts the wafer height and directs the system to expose the wafer (block 100). Controller 56 then evaluates the x, y coordinates to determine if all the areas have been exposed (block 102). If not (104), stage 50 is moved to the next exposure area (block 106), and the process of blocks 98–102 is repeated, until the last area is exposed (108), whereupon the wafer process is complete (block 110).

Industrial Applicability

The method and apparatus of the present invention has particular industrial applicability in the area of photo lithography. Within this area, applications in semiconductor fabrications and manufacturing of magnetic thin film heads are of particular interest. The present invention makes possible the construction of smaller etched line widths and gaps, due to the improved focusing provided. Smaller line widths and gaps translate to higher frequency, faster performance and smaller sized devices.

Although a preferred embodiment of the present invention has been described above, it will be appreciated that certain alterations and modifications thereof will become apparent to those skilled in the art. It is therefore intended that the appended claims be interpreted as covering all such alterations and modifications as fall within the true spirit and scope of the invention.

What is claimed is:

1. A method for improving focus on an area of a surface of a material to be processed in a lithographic system, said method comprising:
    (a) scanning said surface to obtain uncorrected surface height data;
    (b) determining periodic height variation data from said uncorrected data;
    (c) subtracting said periodic height variation data from said uncorrected surface height data to create corrected surface height data;
    (d) calculating optimum focus height data from said corrected surface height data; and
    (e) setting the height of said surface to an optimum focus height corresponding to said optimum focus height data.

2. A method as recited in claim 1 wherein said determining includes modeling said periodic height variation data with a Fourier series, and calculating a particular value of said periodic variation data from said Fourier series for use in said subtracting.

3. A method as recited in claim 1 wherein said calculating includes calculating the average of said corrected surface height data as said optimum focus height data.

4. A method as recited in claim 1 further comprising:
    (a) calculating surface level data of said surface from said corrected surface height data; and
    (b) adjusting said surface using said surface level data such that said area is optimally perpendicular to an optics axis of said lithographic system.

5. A lithographic system providing improved focus on an area of a surface of a material to be processed, said system comprising:
    (a) a projection lens system having an optics axis;
    (b) a stage for positioning said material;
    (c) means for detecting a height of a point on said area of said surface;
    (d) means for positioning said stage;
    (e) controller means including
        (i) scanning means responsive to said means for detecting, for directing said means for positioning to scan said surface and obtain uncorrected surface height data;
        (ii) means for determining periodic height variation data from said uncorrected data;
        (iii) means for subtracting said periodic height variation data from said uncorrected surface height data to create corrected height data;
        (iv) means for calculating optimum focus height data from said corrected surface height data; and
        (v) means for directing said means for positioning to position said stage so as to place said area at an optimum focus point along said optics axis.

6. A system as recited in claim 5 wherein said means for determining includes means for modeling said periodic height variation data with a Fourier series, and calculating a particular value of said periodic variation data from said Fourier series for use in said subtracting.

7. A system as recited in claim 5 wherein said means for calculating includes means for calculating the average of said corrected surface height data as said optimum focus height data.

8. A system as recited in claim 5 wherein said controller means further includes (a) means for calculating surface level data of said surface from said corrected surface height data; and (b) means for directing said means for positioning to adjust said surface using said surface level data such that said area is optimally perpendicular to said optics axis.

9. An apparatus for improving focus on an area of a surface of a material to be processed in a lithographic system, said system having a projection lens system having an optics axis, and a stage for positioning said material, and means for detecting height of a point on said area of said surface, and means for positioning said stage, said apparatus comprising:

controller means including (a) scanning means responsive to said means for detecting, for directing said means for positioning to scan said surface and obtain uncorrected surface height data;

(b) means for determining periodic height variation data from said uncorrected data;

(c) means for subtracting said periodic height variation data from said uncorrected surface height data to create corrected height data;

(d) means for calculating optimum focus height data from said corrected surface height data; and (e) means for directing said means for positioning to position said stage so as to place said area at an optimum focus point along said optics axis.

10. A system as recited in claim 9 wherein said means for determining includes means for modeling said periodic height variation data with a Fourier series, and calculating a particular value of said periodic variation data from said Fourier series for use in said subtracting.

11. A system as recited in claim 9 wherein said means for calculating includes means for calculating the average of said corrected surface height data as said optimum focus height data.

12. A system as recited in claim 9 wherein said controller means further includes (a) means for calculating surface level data of said surface from said corrected surface height data; and (b) means for directing said means for positioning to adjust said surface using said surface level data such that said area is optimally perpendicular to said optics axis.

* * * * *